United States Patent
Ng et al.

(10) Patent No.: US 8,143,870 B2
(45) Date of Patent: Mar. 27, 2012

(54) METHODS AND APPARATUS FOR CURRENT SENSING

(76) Inventors: Timothy M. Ng, Monterey Park, CA (US); Jinghong Guo, Torrance, CA (US); Kenneth Ostrom, Palos Verdes Estates, CA (US)

(*) Notice: Subject to any disclaimer, the term of this patent is extended or adjusted under 35 U.S.C. 154(b) by 665 days.

(21) Appl. No.: 12/332,910

(22) Filed: Dec. 11, 2008

(65) Prior Publication Data

US 2009/0146620 A1  Jun. 11, 2009

Related U.S. Application Data

(60) Provisional application No. 61/012,890, filed on Dec. 11, 2007.

(51) Int. Cl.
*G05F 1/573* (2006.01)
(52) U.S. Cl. ....................................................... 323/277
(58) Field of Classification Search .................. 323/265, 323/273–277, 280, 282, 283, 286, 351
See application file for complete search history.

(56) References Cited

U.S. PATENT DOCUMENTS

| | | | | |
|---|---|---|---|---|
| 6,127,814 | A * | 10/2000 | Goder | 323/282 |
| 6,683,441 | B2 * | 1/2004 | Schiff et al. | 323/222 |
| 6,737,845 | B2 * | 5/2004 | Hwang | 323/284 |
| RE38,780 | E * | 8/2005 | Hawkes et al. | 323/282 |
| 7,466,894 | B2 * | 12/2008 | Schiff et al. | 385/147 |
| 7,541,793 | B2 * | 6/2009 | Saeueng et al. | 323/284 |
| 7,936,160 | B1 * | 5/2011 | Sheehan | 323/285 |
| 7,990,120 | B2 * | 8/2011 | Leonard et al. | 323/282 |
| 2006/0091870 | A1 * | 5/2006 | Yoshida et al. | 323/282 |
| 2007/0236204 | A1 * | 10/2007 | Tateno et al. | 323/316 |
| 2009/0085501 | A1 * | 4/2009 | Cross | 315/307 |

* cited by examiner

*Primary Examiner* — Adolf Berhane
(74) *Attorney, Agent, or Firm* — Murphy, Bilak & Homiller, PLLC

(57) ABSTRACT

Methods and apparatus for current sensing according to various aspects of the present invention operate in conjunction with a current sensor adapted to sense the current provided to a load via a transistor. In one embodiment, a power supply includes the current sensor, and supplies the current through a series combination of an inductor and the transistor. The current sensor is adapted to generate the inductor current signal according to a sensed current in the inductor, and may comprise a series combination of a first resistor and a second resistor. The resistive series combination is adapted to be connected in parallel to the series combination of the inductor and the transistor.

18 Claims, 6 Drawing Sheets

US 8,143,870 B2

METHODS AND APPARATUS FOR CURRENT SENSING

CROSS-REFERENCES TO RELATED APPLICATIONS

This application claims the benefit of U.S. Provisional Patent Application No. 61/012,890, filed Dec. 11, 2007, and incorporates the disclosure of such application by reference.

BACKGROUND OF THE INVENTION

Switching power supplies are popular for high power applications because of the high efficiency and small area and volume required. Buck converters in particular are well suited to providing the high current at low voltages needed by high performance digital integrated circuits such as microprocessors, graphics processors, and network processors. For example, a buck converter is often used to step down a DC voltage (typically referred to as the input voltage) to a lower DC voltage (typically referred to as the output voltage). Since the power stage is fully switched (i.e., the power MOSFET is fully off or on), there is very little loss in the power stage and the converter power efficiency is very high.

In addition to monitoring the output voltage, controllers may also monitor load current. One way to sense the load current is through the output inductor and/or transistor. The current through the output inductor and transistor is representative of the instantaneous load current, which may be used to implement adaptive voltage positioning (AVP), optimize the control mechanism (current mode control), limit the maximum output current, or monitor the operating condition of the regulator. The inductor and transistor current also represents the current through the power devices, the transistors, and the inductor, all of which have maximum current limitations which must be adhered to. Further, in multiphase buck converters, sensing current in each phase allows the controller to balance the output current between all the phases.

RDSon current sense is a popular technique for monitoring the load current because it is a lossless current sense method, and is relatively easy to implement with just a few additional components. Further, the DC level of the signal is guaranteed to be near ground regardless of the regulated output voltage. For example, referring to FIGS. 1A-B, a widely used lossless RDSon current sense model senses current according to the resistance (RDSon) of a transistor in series with a buck inductor, such as a power MOSFET in the output stage of a converter for periodically connecting the load to the input voltage. When the MOSFET is activated, the MOSFET exhibits a resistance $R_{FET}$, which may be modeled as a separate resistance (FIG. 1B). Assuming the RDSon of the MOSFET is known, the output current may be determined according to the voltage across the MOSFET divided by the resistance of the resistor $R_{FET}$.

SUMMARY OF THE INVENTION

Methods and apparatus for current sensing according to various aspects of the present invention operate in conjunction with a current sensor adapted to sense the current provided to a load via a transistor. In one embodiment, a power supply includes the current sensor, and supplies the current through a series combination of an inductor and the transistor. The current sensor is adapted to generate the inductor current signal according to a sensed current in the inductor, and may comprise a series combination of a first resistor and a second resistor. The resistive series combination is adapted to be connected in parallel to the series combination of the inductor and the transistor.

BRIEF DESCRIPTION OF THE DRAWING FIGURES

A more complete understanding of the present invention may be derived by referring to the detailed description and claims when considered in connection with the following illustrative figures. In the following figures, like reference numbers refer to similar elements and steps throughout the figures.

FIGS. 1A-B are schematic diagrams of an inductor and transistor circuit.

Figure 4B:
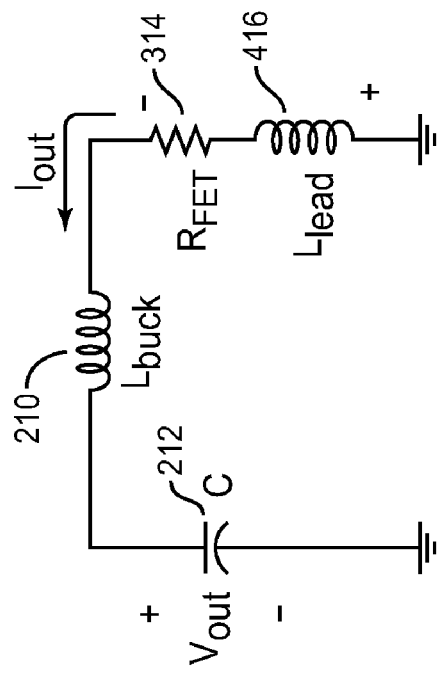
Figure 4A:
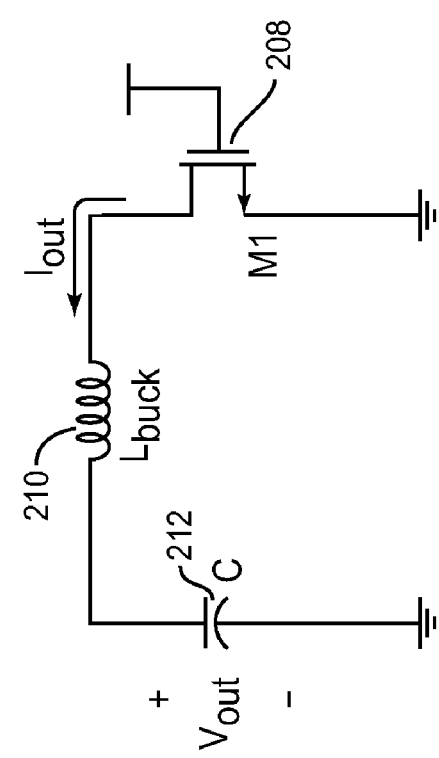

FIGS. 4A-B are schematic diagrams of an inductor and transistor circuit.

Figure 5:
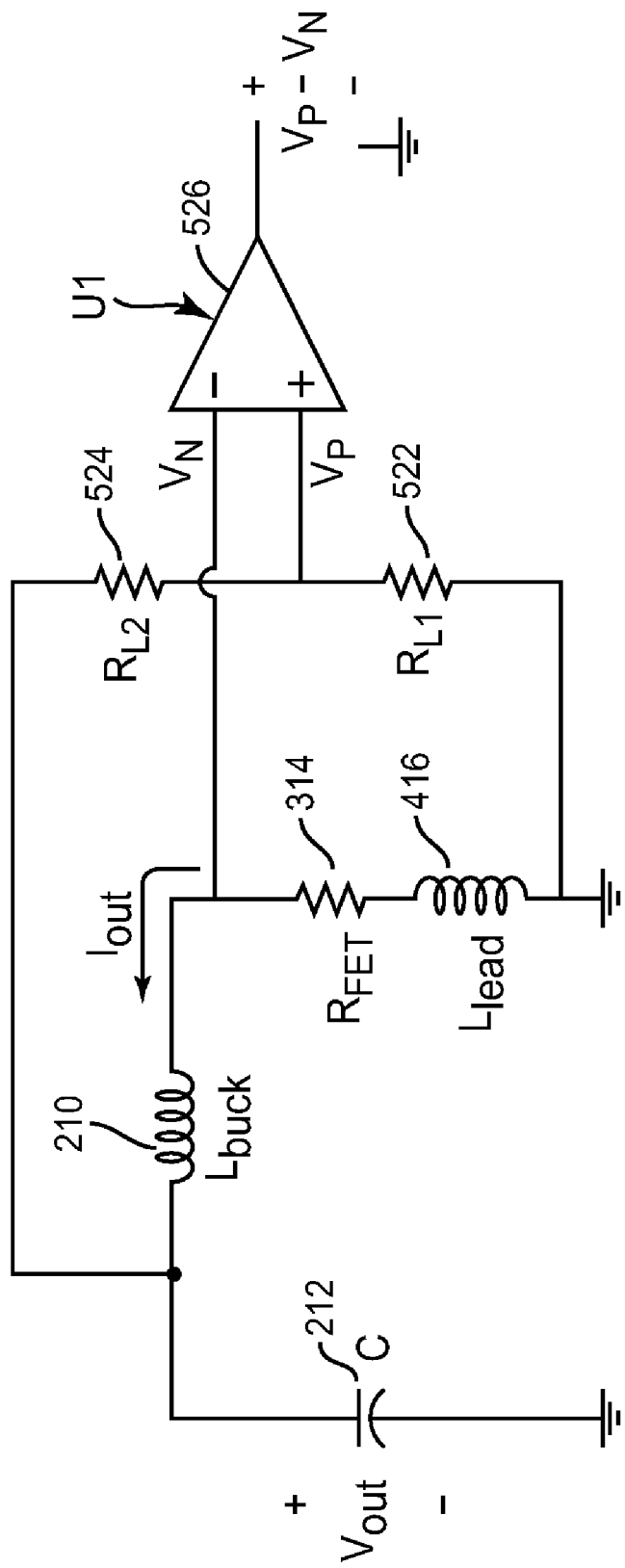

FIG. 5 is a schematic diagram of a current sensor.

Figure 6:
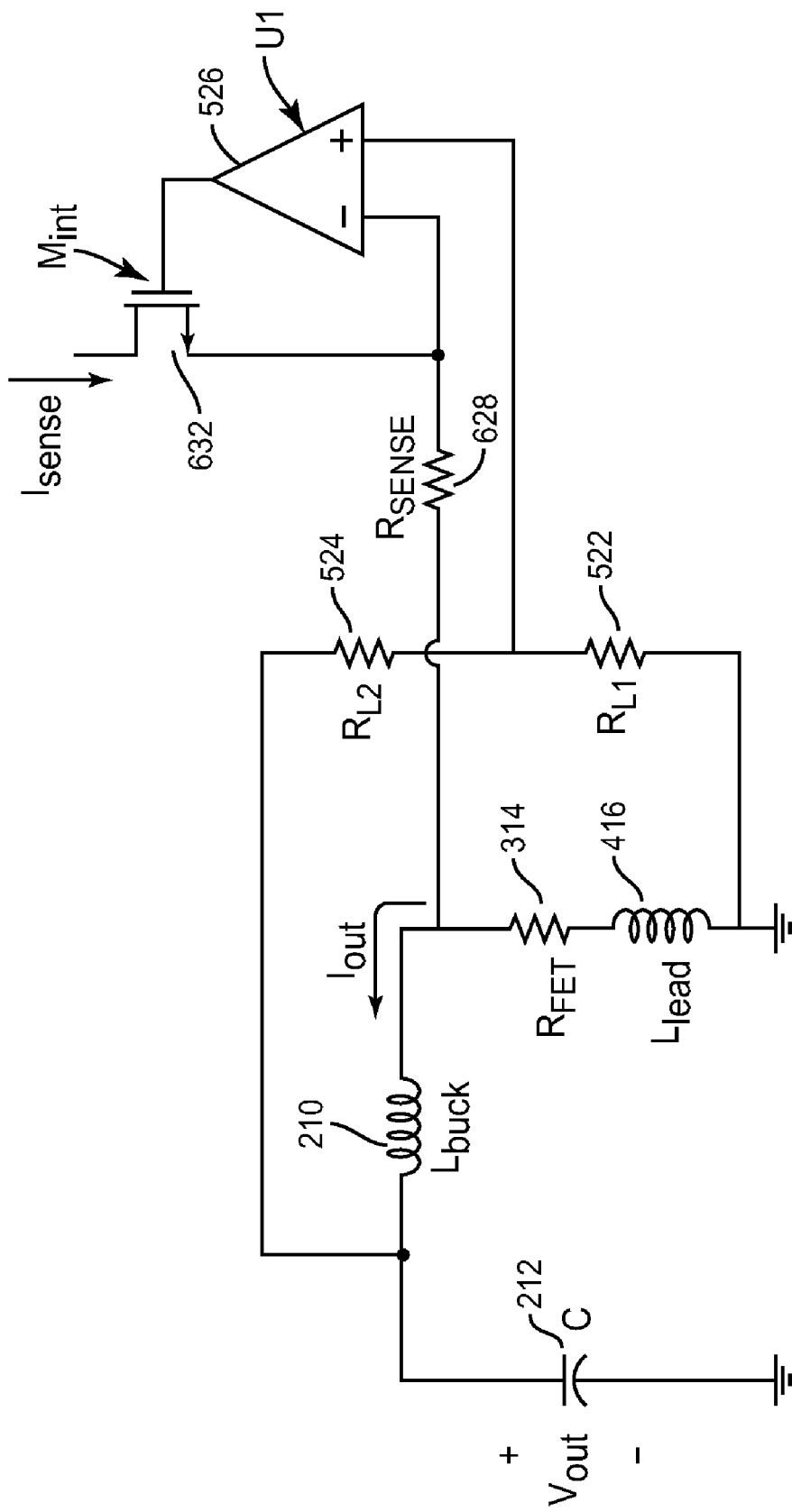

FIG. 6 is a schematic diagram of a current sensor.

Elements and steps in the figures are illustrated for simplicity and clarity and have not necessarily been rendered according to any particular sequence. For example, steps that may be performed concurrently or in different order are illustrated in the figures to help to improve understanding of embodiments of the present invention.

DETAILED DESCRIPTION OF EXEMPLARY EMBODIMENTS

The present invention may be described in terms of functional block components and various processing steps. Such functional blocks may be realized by any number of circuits, technologies, techniques, and methods configured to perform the specified functions and achieve the various results. For example, the present invention may employ various controllers, sensors, power supplies, logic circuits, amplifiers, output stages, and the like, which may carry out a variety of functions. In addition, the present invention may be practiced in conjunction with any number of devices for performing the various functions, and the systems described are merely exemplary embodiments and applications. Further, the present invention may employ any number of conventional techniques controlling output stages, receiving and processing signals, sensing voltages and currents, amplifying signals, and the like.

Figure 1B:
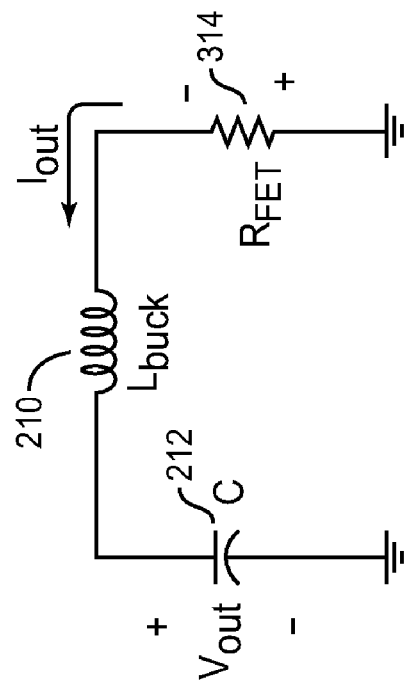
Figure 1A:
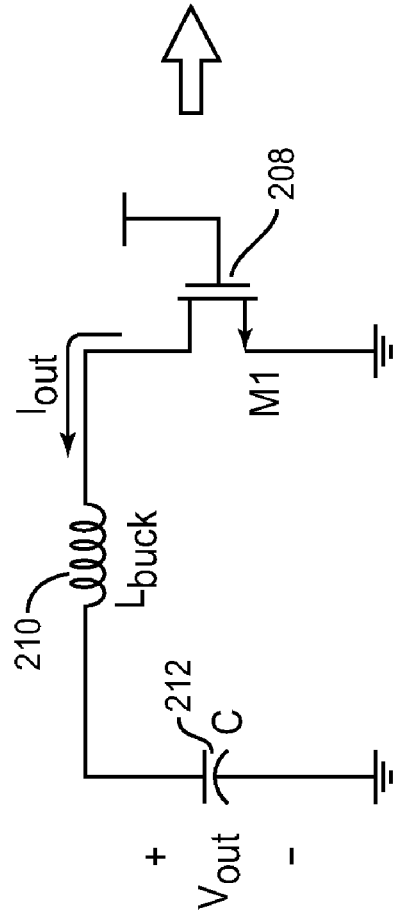
Figure 2:
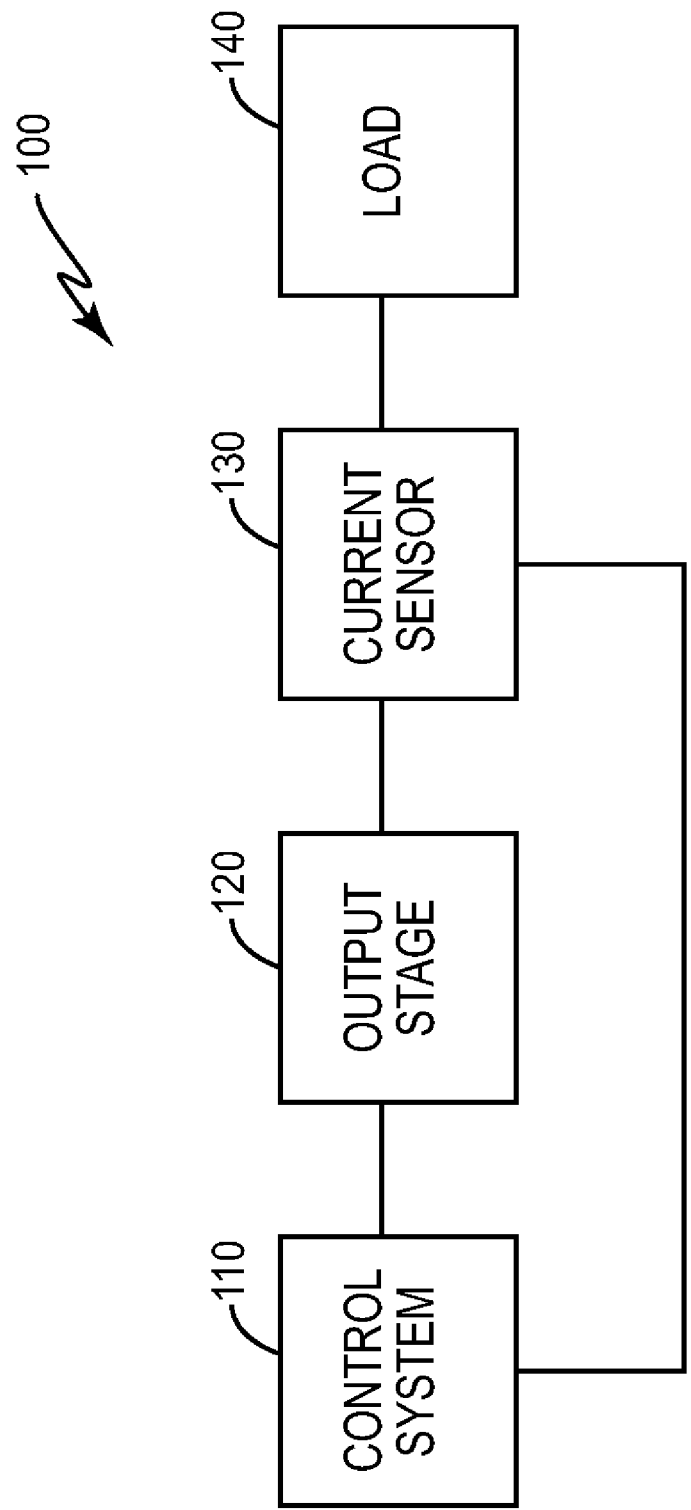
FIG. 2 is a block diagram of a power supply according to various aspects of the present invention.

Methods and apparatus for current sensing according to various aspects of the present invention operate in conjunction with a current sensor adapted to sense the current provided to a load via a transistor. For example, referring to FIG. 2, a power supply 100 for supplying current to a load 140 according to various aspects of the present invention comprises a control system 110, an output stage 120, and a current sensor 130. The control system 110 drives the output stage 120, and the output stage 120 provides current to the load 140. The current sensor 130 detects the current and provides a corresponding signal to the control system 110 to control the output stage 120 accordingly. Various aspects of the present invention may be applied to any appropriate power supply, such as buck, boost, buck-boost, forward, flyback, half-bridge, full-bridge, and SEPIC topologies. Further, various aspects of the present invention may be applied to any suitable circuit where lossless sensing of inductor current is of use. In addition, various aspects of the present invention relate to providing a signal to a sensing element. In the present embodiment, the sensing element comprises the control system 110 and/or an amplifier, but the sensing element may comprise any suitable system configured to receive the signal from the current sensor 130.

Figure 3:
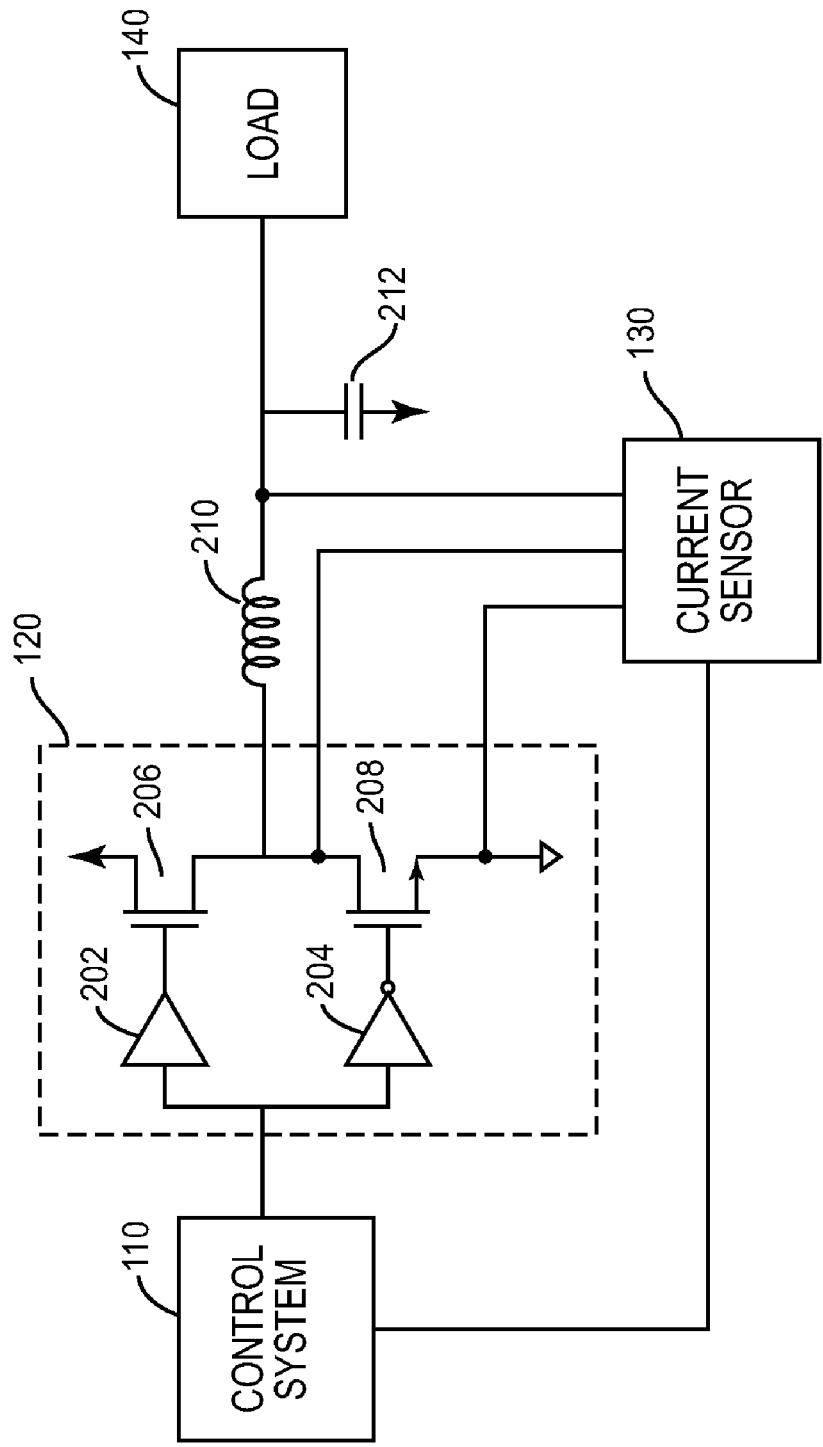
FIG. 3 is a block diagram of a power supply with an output stage.

The output stage 120 is responsive to the control system 110 and provides current to the load 140 according to a drive signal from the control system 110. The output stage 120 may comprise any appropriate system for providing current to the load 140 according to signals from the control system, such as a conventional output stage for a buck converter. The output stage 120 may also comprise a single phase or multiple phases. Referring to FIG. 3, an exemplary single-phase output stage 120 for a DC/DC buck converter may comprise one or more driver circuits 202, 204 and a pair of transistors, such as a high-side FET 206 and a low-side FET 208. The transistors may comprise any appropriate switches, such as conventional MOSFETs used in power supplies. The driver circuits 202, 204 alternately drive the FETs 206, 208 to alternately connect the load 140 to the input voltage $V_{IN}$ according to signals from the control system 110, such as a conventional pulse width modulated control signal. The FETs 206, 208 may be synchronous or asynchronous; in the present embodiment, the FETs 206, 208 are configured to be synchronous.

A filter circuit smoothes the voltage and current applied to the load 140. The filter circuit may comprise any suitable filter system, such as an analog or digital filter. In the present embodiment, the filter circuit comprises passive components, such as an inductor 210 and a capacitor 212. For example, the filter circuit may comprise a conventional buck inductor and decoupling capacitor for a buck converter. The alternating activation of the FETs 206, 208 by the driver circuit 202, 204 generates a switching waveform or square wave that is subsequently filtered by the filter circuit, which allows the output voltage to be set by controlling the duty cycle of the waveform. While the present embodiment relates to a single phase, the power supply 100 may be adapted to employ multiple phases and/or to sum the current in two or more phases.

The control system 110 generates the control signal to drive the output stage 120. The control system 110 may generate the control signal according to any appropriate techniques and criteria, such as using conventional voltage and/or current feedback to control the voltage and/or current applied to the load 140. The control system 110 may also include any appropriate elements and systems for generating the control signal, and the topology of the control system 110 may be analog and/or digital control based. For example, referring again to FIG. 2, the control system 110 may include a PWM controller generating a PWM drive signal to drive the output stage 120. The control system 110 may control the output stage 120 according to any appropriate criteria, such as output voltage and/or output current at the load 140.

In the present embodiment, the control system 110 comprises a conventional PWM-based voltage regulator for a power supply that adjusts the duty cycle of a PWM drive signal according to output voltage and/or current compared to one or more target output voltages and/or currents. The control system 110 may monitor the output voltage as well as the load 140 current, which may facilitate various control functions. For example, the current in the inductor 210 is representative of the instantaneous load 140 current, which can be used to implement adaptive voltage positioning (AVP) or current mode control or to monitor the operating condition of the power supply 100. The inductor 210 current also represents the current through the power devices, one or more of the FETs 206, 208, and the inductor 210, all of which have maximum current limitations which must be adhered to. Furthermore, in multi-phase converters, the inductor 210 current may be balanced between phases so that the load 140 current is evenly distributed among phases, so the current balance control mechanism requires the ability to sense the current in each phase. Thus, the control system 110 may utilize the sensed current to optimize the supply of power, limit the maximum output current, and/or implement load dependent output voltage such as adaptive voltage positioning (AVP).

The power supply 100 may further comprise an amplifier to amplify the signal from the current sensor 130 and provide the amplified signal to the control system 110. The amplifier may comprise any appropriate system for amplifying a signal, such as a conventional op-amp-based amplifier. The amplifier may comprise a separate component or be integrated into another component, such as the sensor 130 or the control system 110. Referring to FIG. 5, in the present embodiment, the amplifier 526 comprises a differential amplifier and is integrated into the control system 110. The amplifier 526 may provide the amplified current sensor 130 signal to the control system 110. The inductor current signal output by the current sensor 130 may be interfaced to the control system 110, however, in any appropriate manner.

The current sensor 130 senses the current through a series branch, such as a branch including the inductor 210 and the low-side FET 208 (while the low-side FET 208 is in the ON state), and provides a corresponding inductor current signal to the control system 110, such as via the amplifier 526. The current sensor 130 of the present embodiment is adapted for accurately sensing the current in the inductor branch, such as through the inductor 210 and the low-side FET 208. The current sensor 130 may generate the inductor current signal, such as a voltage signal or a current signal, representing the current in the inductor 210, FET 208, load 140, and/or other elements of the power supply 100.

For example, the current sensor 130 may comprise an RDSon current sense adapted to sense current in conjunction with the lead inductance ($L_{lead}$) of one or more additional components in the circuit, such as the FET 208. Referring to FIGS. 4A-B, the inductor 210 and the FET 208 may be configured in a series combination when the FET 208 is in the ON state. The FET 208 exhibits a resistance 314 and an inductance 416. The inductance 416 is designated as a lead inductance ($L_{lead}$), and includes inductances associated with the FET 208 or other component, such as package inductances and trace inductances.

The voltage across an inductance is represented by the inductance multiplied by the instantaneous rate of current $I_{out}$ change. For many applications, such as converter applications involving high bandwidth and small buck inductances, the rate of change of output current may be very high. Consequently, the lossless RDSon current sensor 130 of the present embodiment may generate more accurate measurement of the current by sensing the current in conjunction with the inductances associated with elements other than the inductor 210, such as the lead inductances associated with the FET 208.

The current sensor 130 may be configured in any appropriate manner to sense the current in the inductor 210 branch. For example, referring now to FIG. 5, the current sensor 130 may be configured to generate a voltage signal corresponding to the sensed current. In one embodiment, the current sensor 130 comprises a resistor divider circuit connected to the amplifier 526. The resistor divider circuit may include a first resistor 522 and a second resistor 524, and the amplifier 526 may have an input connected to the node between the first and second resistors 522, 524. The other input of the amplifier 526 may be connected to the node between the inductor 210 and the FET 208. The amplifier 526 is configured in a differential mode to generate a signal according to a difference between the input voltages. The values of the resistors 522, 524 may be selected such that the ratio of the first resistor 522 resistance value to the second resistor 524 resistance value is substantially equal to the ratio of the lead inductance 416 value to the inductor 210 inductance value.

The present current sensor 130 generates a voltage signal proportional to the current in the inductor 210. The output current travels through the FET 208, the inductor 210, and the load 140. The voltage across an inductor is equal to the inductance of the inductor multiplied by the rate of change of the current through the inductor. Thus, the voltage across the lead inductance 416 is:

$$V_{lead} = L_{lead} \frac{\partial}{\partial t} I_{out}$$

The voltage across the inductor 210 is:

$$V_{buck} = L_{buck} \frac{\partial}{\partial t} I_{out}$$

The voltage across the resistive component of the FET 208 is:

$$V_{RDSon} = R_{FET} \times I_{out}$$

The output current is represented by $I_{out}$.

The voltage across the capacitor 212 is equal to the sum of the voltage across the lead inductor 416, the voltage across the resistor 314, and the voltage across the output (buck) inductor 210:

$$V_{out} = V_{lead} - V_{RDSon} + V_{buck}$$

Therefore, the voltage across the capacitor 212 may be expressed as:

$$V_{out} = -L_{lead} \frac{\partial}{\partial t} I_{out} - R_{FET} \times I_{out} - L_{buck} \frac{\partial}{\partial t} I_{out}$$

If the voltage across FET resistance 314 is small relative to the voltage across the capacitor 212, then the voltage at the capacitor 212 is approximately equal to the sum of the voltage across the lead inductance 416 and the voltage across the inductor 210:

$$V_{out} \approx V_{lead} + V_{buck}$$

The voltage across lead inductor 416 may then be expressed as:

$$V_{lead} \approx \frac{L_{lead}}{L_{lead} + L_{buck}} \times V_{out}$$

In the present embodiment, the current sensor 130 comprises a resistor divider such that the ratio of the resistance $R_{L1}$ of the first resistor 522 to the resistance $R_{L2}$ of the second resistor 524 is equal to the ratio of the inductance $L_{lead}$ of the lead inductor 416 to the inductance $L_{buck}$ of the inductor 210:

$$\frac{R_{L1}}{R_{L2}} = \frac{L_{lead}}{L_{buck}}$$

The voltage at one terminal of the amplifier 526 may be determined by the voltage at the node between the first resistor 522 and the second resistor 524:

$$V_P = \frac{R_{L1}}{R_{L1} + R_{L2}} \times V_{out}$$

or $$V_P = \frac{L_{lead}}{L_{lead} + L_{buck}} \times V_{out}$$

The voltage at the other terminal of the amplifier 526 may be determined by the voltage at the node between the FET 208 and the inductor 210:

$$V_N = \frac{L_{lead}}{L_{lead} + L_{buck}} \times V_{out} - R_{FET} \times I_{out}$$

The amplifier 526 generates a differential signal according to the difference between the voltages at the inputs $V_P$ and $V_N$. The output signal is thus:

$$V_P - V_N = \frac{L_{lead}}{L_{lead} + L_{buck}} \times V_{out} - \left( \frac{L_{lead}}{L_{lead} + L_{buck}} \times V_{out} - R_{FET} \times I_{out} \right)$$
$$= R_{FET} \times I_{out}$$

Consequently, the present current sensor 130 measures the current in the inductor 210 in conjunction with the inductances associated with other components in the inductor 210 branch to generate accurate output signals. In addition, the current sensor 130 may provide a sensed output voltage that is proportional to the output current independent of the absolute values of the buck inductor and/or the lead inductance and independent of the regulated output voltage.

The current sensor 130 may be adapted to generate any appropriate signal to indicate the current in the inductor branch 210 in conjunction with inductance associated with other components. In addition, the current sensor 130 signal may be scaled to generate any suitable range of values in response to a selected range of sensed current. For example, the current sensor 130 may be configured to generate a current signal according to the sensed current, such that the output signal current corresponds to the sensed current. In addition, the current sensor 130 may be configured to generate a sensed output current that is proportional to the output current independent of the absolute values of the buck inductor and/or the lead inductance and independent of the regulated output voltage.

For example, referring to FIG. 6, the current sensor 130 may comprise a transistor 632 and a sense resistor 628 and be adapted to convert the RDSon voltage information into a scaled current for processing by the control system 110. While the present discussion relates to a specific implementation of the current sensor 130, other current sensor 130 circuit topologies may benefit from the attributes of selectable gain, and the implementations and principles of the present embodiment may be adapted to such other topologies.

In the present embodiment, the sense resistor 628 connects the node between the FET 208 and the output inductor 210 to one terminal of the amplifier 526. The transistor 632 connects the node between the sense resistor 628 and the terminal of the amplifier 526 to the control system 110. The output of the amplifier 526 controls the transistor 632. The present configuration provides a feedback loop for the amplifier 526, which tends to drive both terminals of the amplifier 526 to the same voltage. When the FET 208 is turned on, current flows from the ground to the load (i.e., from the source of the FET 208 to the drain of the FET 208). The voltage at the drain of the FET 208 becomes more negative relative to the voltage at the source of the FET 208. In response, the amplifier 526 controls the transistor 632 to generate a sense current $I_{sense}$ according to the difference in voltage through the sense resistor 628 $R_{SENSE}$. In the present lead compensation network, the voltage across $R_{SENSE}$ is the same as the voltage computed by $R_{FET} \times I_{OUT}$. Thus, $I_{sense}$ can be expressed as:

$$I_{sense} = \frac{R_{FET} \times I_{out}}{R_{SENSE}}$$

The current sensor 130, amplifier 526, and/or control system 110 may be modified in any appropriate manner, for example to integrate various aspects of the current sensor 130 and/or amplifier 526 into the control system 110.

The particular implementations shown and described are illustrative of the invention and its best mode and are not intended to otherwise limit the scope of the present invention in any way. For the sake of brevity, conventional manufacturing, connection, preparation, and other functional aspects of the system may not be described in detail. The connecting lines shown in the various figures are intended to represent exemplary functional relationships and/or physical couplings between the various elements. Many alternative or additional functional relationships or physical connections may be present in a practical system.

In the foregoing description, the invention has been described with reference to specific exemplary embodiments. Various modifications and changes may be made, however, without departing from the scope of the present invention as set forth and claimed. The description and figures are to be regarded in an illustrative manner, not a restrictive one, and all such modifications are intended to be included within the scope of the present invention. Accordingly, the scope of the invention should be determined by the generic embodiments described and their legal equivalents rather than by merely the specific examples described above. For example, the steps recited in any method or process embodiment may be executed in any order and are not limited to the explicit order presented in the specific examples. Additionally, the components and/or elements recited in any apparatus embodiment may be assembled or otherwise operationally configured in a variety of permutations to produce substantially the same result as the present invention and are not limited to the specific configuration recited in the specific examples.

Benefits, other advantages and solutions to problems have been described above with regard to particular embodiments; however, any benefit, advantage, solution to problems or any element that may cause any particular benefit, advantage or solution to occur or to become more pronounced are not to be construed as critical, required or essential features or components.

The terms "comprises", "comprising", or any variation thereof, are intended to reference a non-exclusive inclusion, such that a process, method, article, composition, or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted to specific environments, applications, manufacturing specifications, design parameters, or other operating requirements without departing from the general principles of the same.

The invention claimed is:

1. A power supply for supplying a current through series combination of an inductor and a transistor, comprising:
   a control system adapted to control the current according to an inductor current signal;
   a current sensor connected to the control system, wherein the current sensor:
      is adapted to generate an inductor current signal according to a sensed current in the inductor; and
      comprises a series combination of a first resistor and a second resistor, wherein the series combination is adapted to be connected in parallel to the series combination of the inductor and the transistor; and
   a differential amplifier comprising a first input adapted to be connected to a node between the inductor and the transistor and a second input connected to a node between the first resistor and the second resistor.

2. A power supply according to claim 1, wherein a ratio of a resistance of the first resistor to a resistance of the second resistor substantially matches a ratio of a lead inductance of the transistor to an inductance of the inductor.

3. A power supply according to claim 1, wherein the current sensor further comprises a third resistor comprising a first terminal adapted to be connected to a terminal of the transistor and a second terminal connected to the control system, wherein a resistance of them third resistor is selected according to a selected range of inductor current signal values to represent a selected range of sensed currents.

4. A power supply according to claim 1, wherein the current sensor further comprises a third resistor, wherein:
   the first input of the amplifier is adapted to be connected to the node between the inductor and the transistor via the third resistor; and
   a resistance of the third resistor is selected according to a scaled range of output signals corresponding to a selected range of sensed current.

5. A power supply according to claim 1, further comprising a second transistor having a first terminal connected to an output of the amplifier, wherein the second transistor is adapted to generate the inductor current signal according to a signal from the amplifier.

6. A power supply according to claim 1, wherein the control system comprises a PWM controller.

7. A power supply according to claim 1, wherein a voltage Vp at a node between the first resistor and the second resistor is configured to be:

$$V_P = \frac{R_{L1}}{R_{L1} + R_{L2}} \times V_{out}$$

where $R_{L1}$ is a resistance of the first resistor, $R_{L2}$ is a resistance of the second resistor, and $V_{out}$ is an output voltage of the series combination of the inductor and the transistor.

8. A power supply according to claim 1, wherein a voltage $V_N$ at a node between the inductor and the transistor is configured to be:

$$V_N = \frac{L_{lead}}{L_{lead} + L_{buck}} \times V_{out} - R_{FET} \times I_{out}$$

where $L_{lead}$ is a lead inductance of the transistor, $L_{buck}$ is an inductance of the inductor, $R_{FET}$ is a resistance of the transistor, $I_{out}$ is the current, and $V_{out}$ is an output voltage of the series combination of the inductor and the transistor.

9. A power supply according to claim 1, wherein the inductor current signal is proportional to the sensed current independent of an absolute value of the inductor and an absolute value of a lead inductance of tile transistor.

10. A power supply according to claim 1, wherein the inductor current signal is proportional to the sensed current independent of a regulated output voltage of the power supply.

11. A current sensor for providing an inductor current signal corresponding to a sensed current in a series combination of an inductor and a synchronous MOSFET during an ON state of the MOSFET, comprising:
a first resistor comprising a first terminal connected to a source terminal of the MOSFET;
a second resistor having a first terminal connected to a second terminal of the first resistor and a second terminal connected to the inductor; and
a differential amplifier comprising:
a first input connected to a node between the first resistor and the second resistor; and
a second input adapted to be connected to a drain terminal of the MOSFET,
wherein the inductor current signal is proportional to the sensed current independent of an absolute value of the inductor and an absolute value of a lead inductance of the MOSFET.

12. A current sensor according to claim 11, wherein a ratio of a resistance of the first resistor to a resistance of the second resistor substantially matches a ratio of a lead inductance associated with the MOSFET to an inductance of the inductor.

13. A current sensor according to claim 11, wherein the current sensor further comprises a third resistor comprising a first terminal adapted to be connected to the drain terminal of the MOSFET, wherein a resistance of the third resistor is selected according to a selected range of inductor current signal values to represent a selected range of sensed currents.

14. A current sensor according to claim 11, wherein the current sensor further comprises a third resistor, wherein:
the first input of the amplifier is adapted to be connected to the drain terminal of the MOSFET via the third resistor; and
a resistance of the third resistor is selected according to a scaled range of output signals corresponding to a selected range of sensed current.

15. A current sensor according to claim 14, further comprising a transistor having a control terminal connected to an output of the amplifier, wherein the transistor is adapted to generate the inductor current signal according to a signal from the amplifier.

16. A current sensor according to claim 11, wherein a voltage $V_P$ at the node between the first resistor and the second resistor is configured to be:

$$V_P = \frac{R_{L1}}{R_{L1} + R_{L2}} \times V_{out}$$

where $R_{L1}$ is a resistance of the first resistor, $R_{L2}$ is a resistance of the second resistor, and $V_{out}$ is an output voltage of the series combination of the inductor and the MOSFET.

17. A current sensor according to claim 11, wherein a voltage $V_N$ at the drain terminal of the MOSFET is configured to be:

$$V_N = \frac{L_{lead}}{L_{lead} + L_{buck}} \times V_{out} - R_{FET} \times I_{out}$$

where $L_{lead}$ is a lead inductance of the MOSFET, $L_{buck}$ is an inductance of the inductor, $R_{FET}$ is a resistance of the MOSFET, $I_{out}$ is the sensed current, and $V_{out}$ is an output voltage of the series combination of the inductor and the MOSFET.

18. A method of generating all inductor current signal corresponding to a current in a series combination of an inductor and a transistor, comprising:
connecting a series combination of a first resistor and a second resistor in parallel with the series combination of the inductor and the transistor;
selecting resistance values for the first resistor and the second resistor according to a lead inductance associated with the transistor and an inductance of the inductor, wherein a ratio of a resistance of the first resistor to a resistance of the second resistor substantially matches a ratio of the lead inductance of the transistor to the inductance of the inductor;
receiving a first signal at an amplifier from a node between the first resistor and the second resistor;
receiving a second signal at the amplifier from a node between the inductor and the transistor; and
generating the inductor current signal according to a difference between the first signal and the second signal.

* * * * *